United States Patent
Gupta et al.

(10) Patent No.: US 7,716,612 B1
(45) Date of Patent: May 11, 2010

(54) METHOD AND SYSTEM FOR INTEGRATED CIRCUIT OPTIMIZATION BY USING AN OPTIMIZED STANDARD-CELL LIBRARY

(75) Inventors: Puneet Gupta, Santa Clara, CA (US); Andrew Kahng, Del Mar, CA (US); Saumil Shah, San Jose, CA (US)

(73) Assignee: Tela Innovations, Inc., Campbell, CA (US)

( * ) Notice: Subject to any disclaimer, the term of this patent is extended or adjusted under 35 U.S.C. 154(b) by 615 days.

(21) Appl. No.: 11/602,043

(22) Filed: Nov. 20, 2006

Related U.S. Application Data

(60) Provisional application No. 60/755,722, filed on Dec. 29, 2005.

(51) Int. Cl.
*G06F 17/50* (2006.01)

(52) U.S. Cl. .............. 716/2; 716/17; 716/18; 703/16

(58) Field of Classification Search ........... 716/2, 716/17, 18; 703/16
See application file for complete search history.

(56) References Cited

U.S. PATENT DOCUMENTS

| | | | | |
|---|---|---|---|---|
| 6,209,123 B1* | 3/2001 | Maziasz et al. | | 716/14 |
| 6,393,601 B1* | 5/2002 | Tanaka et al. | | 716/2 |
| 6,477,695 B1* | 11/2002 | Gandhi | | 716/17 |
| 6,496,965 B1* | 12/2002 | van Ginneken et al. | | 716/10 |
| 6,523,156 B2* | 2/2003 | Cirit | | 716/9 |
| 6,553,544 B2* | 4/2003 | Tanaka et al. | | 716/3 |
| 6,578,179 B2* | 6/2003 | Shirotori et al. | | 716/3 |
| 7,093,208 B2* | 8/2006 | Williams et al. | | 716/3 |
| 7,155,685 B2* | 12/2006 | Mori et al. | | 716/2 |
| 7,185,294 B2* | 2/2007 | Zhang | | 716/2 |
| 7,219,326 B2* | 5/2007 | Reed et al. | | 716/18 |
| 7,225,423 B2* | 5/2007 | Bhattacharya et al. | | 716/18 |
| 7,278,118 B2* | 10/2007 | Pileggi et al. | | 716/1 |
| 7,360,198 B2* | 4/2008 | Rana et al. | | 716/18 |
| 7,366,997 B1* | 4/2008 | Rahmat et al. | | 716/1 |
| 7,441,211 B1* | 10/2008 | Gupta et al. | | 716/2 |
| 2001/0027553 A1* | 10/2001 | Tanaka et al. | | 716/2 |
| 2002/0069396 A1* | 6/2002 | Bhattacharya et al. | | 716/7 |

(Continued)

OTHER PUBLICATIONS

Gupta P. et al, "A practical transistor-level dual threshold voltage assignment methodology", Proc. International Symposium on Quality Electronic Design, 2005, pp. 421-426.

(Continued)

*Primary Examiner*—Phallaka Kik
(74) *Attorney, Agent, or Firm*—Martine, Penilla & Gencarella, LLP

(57) ABSTRACT

A method and system for integrated circuit optimization to improve performance and to reduce leakage power consumption of an integrated circuit (IC). The original IC includes a plurality of nominal cells, and each of the nominal cells includes a plurality of transistors. The method creates an optimized standard-cell library from a standard-cell library. The standard-cell library includes a plurality of nominal cells, and each of the nominal cells includes a plurality of transistors. Further, an optimized IC is generated by using the optimized standard-cell library from the original IC. The optimized IC has an improved performance and reduced leakage power characteristics, as compared to the original IC.

30 Claims, 11 Drawing Sheets

U.S. PATENT DOCUMENTS

| | | | |
|---|---|---|---|
| 2003/0005401 A1* | 1/2003 | Wimer | 716/11 |
| 2003/0088842 A1* | 5/2003 | Cirit | 716/9 |
| 2004/0139405 A1* | 7/2004 | Mori et al. | 716/2 |
| 2004/0230924 A1* | 11/2004 | Williams et al. | 716/2 |
| 2004/0243966 A1* | 12/2004 | Dellinger | 716/17 |
| 2005/0066294 A1* | 3/2005 | Templeton et al. | 716/1 |
| 2006/0064665 A1* | 3/2006 | Zhang | 716/17 |
| 2006/0107239 A1* | 5/2006 | Zhang et al. | 716/1 |
| 2006/0112355 A1* | 5/2006 | Pileggi et al. | 716/1 |
| 2008/0098334 A1* | 4/2008 | Pileggi et al. | 716/1 |
| 2008/0168406 A1* | 7/2008 | Rahmat et al. | 716/2 |
| 2008/0276105 A1* | 11/2008 | Hoberman et al. | 713/300 |
| 2009/0217232 A1* | 8/2009 | Beerel et al. | 716/18 |

OTHER PUBLICATIONS

Gupta P. et al, "Selective gate-length biasing for cost-effective runtime leakage control", Proc. ACM/IEEE Design Automation Conference, 2004, pp. 327-330.

Narendra S. et al., "Leakage issues in IC design: trends, estimation and avoidance", Tutorial, IEEE Intl. Conf. on Computer-Aided Design, 2003.

Mutah S., Douseki T., Marsuya Y., Aoki T. and Shigematru S., "I-V Power supply high-speed digital circuit technology with multithreshold-voltage CMOS", JSSC 1995. vol. 30. No. 8.00. 847-854.

* cited by examiner

METHOD AND SYSTEM FOR INTEGRATED CIRCUIT OPTIMIZATION BY USING AN OPTIMIZED STANDARD-CELL LIBRARY

CROSS REFERENCE TO RELATED APPLICATIONS

This invention claims priority of U.S. Provisional Application Ser. No. 60/755,722 filed Dec. 29, 2005.

BACKGROUND OF THE INVENTION

1. Field of the Invention

This invention relates in general to the design of integrated circuits (ICs), and in particular, to the optimization of standard-cell libraries used to synthesize and optimize ICs.

2. Description of the Related Art

In the design and manufacture of modern Integrated Circuits (ICs), as the transistor geometry has decreased with scaling, high power dissipation is a major concern to IC designers. Typically, leakage power, which is the power consumed by transistors when they are not actively switching, accounts for the major part of the total power consumption in ICs. It is estimated that leakage power accounts for over half of the total power consumption in the 65 nm IC fabrication process. Therefore, IC designers seek to improve the leakage power consumption of an IC without impacting its performance characteristics. In a modern IC design, pre-designed standard-cell libraries are stored in certain databases that provide the components from which an IC is synthesized and optimized. The leakage power consumption and the performance characteristics of the IC depend on the standard-cell library used. Therefore, integrated circuit optimization requires optimization of the standard-cell library.

Several circuit-optimization techniques have been developed to control the consumption of leakage power. Certain of these circuit-optimization techniques create an optimized IC by selectively replacing cells in an existing circuit. The cells are obtained from the standard-cell library. The leakage power and performance characteristics of the optimized IC depend on the quality of the optimizer and the cells available in the library. Some of these techniques are based on the fact that modifying (hereinafter referred to as 'biasing') the gate lengths of transistors by small amounts can reduce leakage power without significant penalties in timing, area or input capacitance, without extra manufacturing cost. Essentially, timing slack is traded off for leakage power. Such techniques, used in the past, assigned the same gate length to every transistor in a cell, which resulted in suboptimal utilization of the available timing slack. Further, assigning the same gate length does not take into account factors such as the difference in the mobility of electrons, which are the principal carriers in the NMOS transistors, and the mobility of holes, which are the principal carriers in the PMOS transistors. Other factors, such as the asymmetry of rise-time and fall-time slacks, are also ignored. Therefore, with respect to the previous techniques, it is possible to intelligently decrease the granularity of length assignment to improve timing-slack utilization.

Other existing leakage reduction techniques use multiple threshold voltage (Vth) libraries, where each cell has 2-3 different Vth variants. The variants are chosen for assignments to different paths, based on the available slack on the paths. These techniques require a separate masking step in the manufacturing process of the IC, for each different Vth. This makes such techniques expensive and limits the number of available threshold voltages to 2 or 3.

Therefore, there exists a need for a method and system that can selectively assign a bias to transistor parameters, such as the transistor gate-length and the threshold voltage of the individual transistors of the cells of a standard-cell library, to improve the leakage and performance of manufactured ICs.

SUMMARY OF THE INVENTION

An object of the invention is to create an optimized standard-cell library from a standard-cell library and generate an optimized integrated circuit (IC) from an original IC by using the optimized standard-cell library. The optimized standard-cell library is created by biasing a transistor parameter such as gate-length or the threshold voltage of a transistor in a nominal cell of the standard-cell library. The optimized IC has improved leakage power consumption and performance, as compared to the original IC.

Various embodiments of the present invention provide a method and system for circuit optimization, to improve the performance and reduce the power consumption of an IC. In the method, an optimized standard-cell library is created from a standard-cell library. The standard-cell library includes a plurality of nominal cells, and each of the nominal cells includes a plurality of transistors. An optimized IC is generated from an original IC by using the optimized standard-cell library.

In accordance with an embodiment, the system includes a library optimization engine and a design optimization engine. The library optimization engine creates an optimized standard-cell library from a standard-cell library. The design optimization engine generates an optimized IC from an original IC by using the optimized standard-cell library.

BRIEF DESCRIPTION OF THE DRAWINGS

So that the above-recited elements of the present invention can be understood in detail, a more particular description of the invention, briefly summarized above, may be had by reference to various embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION OF THE INVENTION

Figure 1:
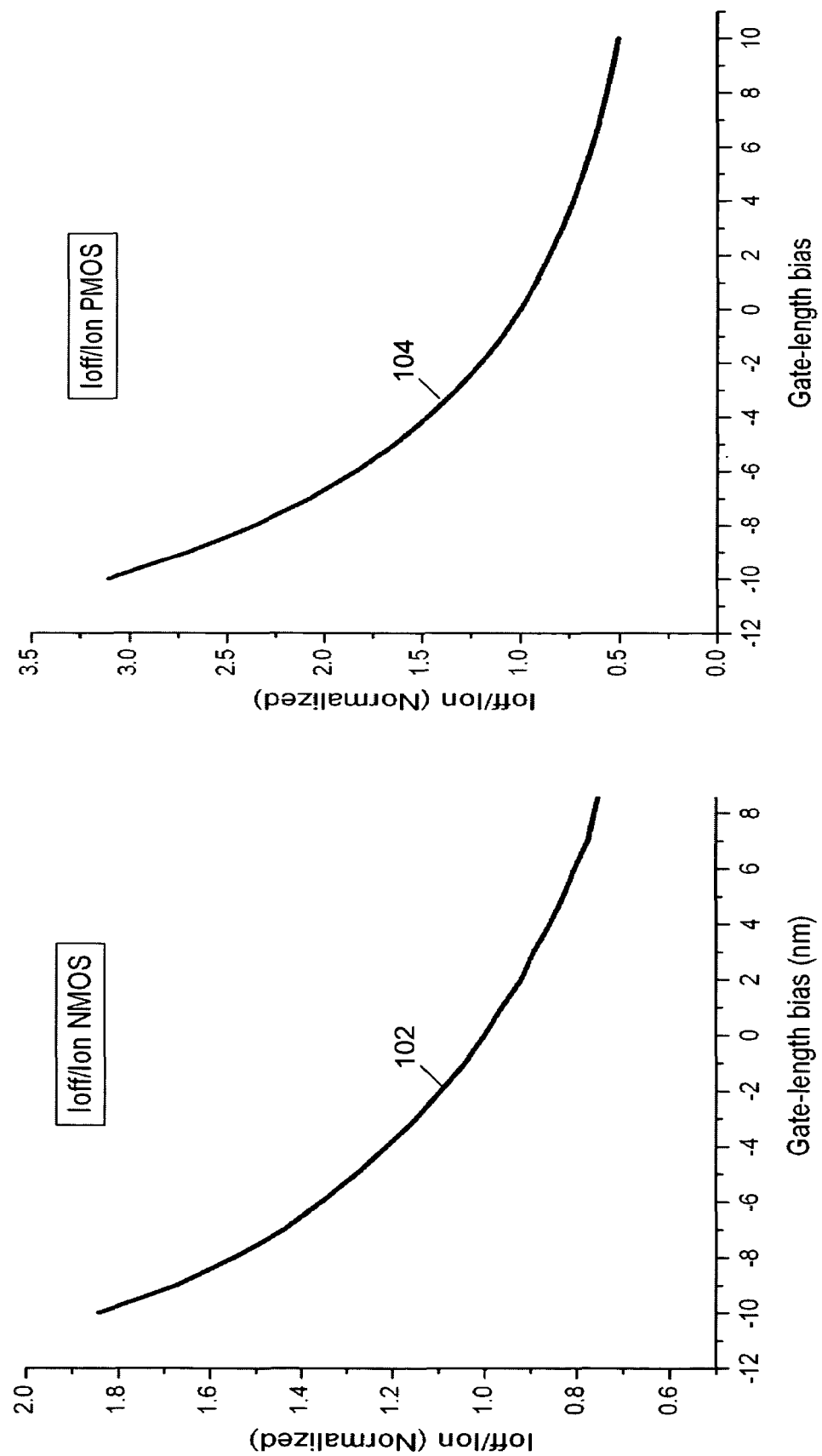
FIG. 1 is a graph representing the ratio of leakage current (Ioff) and drive current (Ion) for PMOS and NMOS transistors in a generic 90 nm (nanometer) process technology.

The present invention relates to a method and system for integrated circuit (IC) optimization. The IC includes a plurality of nominal standard cells, or simply, nominal cells. Each of the plurality of nominal cells includes a plurality of transistors. The present invention provides for a method to improve performance and reduce leakage power consumption by IC optimization. Typically, an improvement in the performance of an IC requires the use of transistors with a higher drive current (Ion), while reduction in leakage power consumption requires the use of transistors with a smaller leakage current (Ioff) value.

Various embodiments of the present invention provide an optimization of a standard-cell library that improves the performance of and reduces leakage power in ICs. The standard-cell library includes a plurality of nominal cells, and each of the plurality of nominal cells includes a plurality of transistors. Optimization of the standard-cell library, to create an optimized standard-cell library, is achieved by modifying one or more existing nominal cells. Modification of the existing nominal cells yields variant cells that are added to the standard-cell library, which are created, based on layout and design rule constraints, technology constraints and the slack characteristics of the nominal cells of the standard-cell library. A cell-variant is generated by assigning a bias solution to a transistor parameter of a transistor of a nominal cell. The transistor parameter can be either a transistor gate-length or a threshold voltage or both. Assigning a bias solution to the transistor parameter involves changing the transistor parameter by a magnitude that is proportionate to the bias solution. The bias solutions are restricted to a set of allowable biases, which includes both positive and negative bias values. Assigning a positive value of a bias solution to the transistor parameter increases the magnitude of the transistor parameter, which, in turn, reduces the Ioff and the Ion of the transistor. On the other hand, applying a negative value of a bias solution can increase the Ioff and the Ion of the transistor. The performance and leakage power consumption characteristics of variant cells are different from the performance and leakage power consumption of nominal cells. This results in an improvement in the performance and leakage power consumption of the optimized IC. Various embodiments also provide the incorporation of a resulting optimized standard-cell library into a design optimization flow. The optimized standard-cell library is used to optimize the netlist of an original IC, to generate an optimized IC.

Depending on layout and design-rule constraints and technology constraints, and the slack characteristics of the nominal cells, selected cell-variants are added to the standard-cell library. The present invention introduces a set of cell-variants, which are grouped, based on an objective function. The objective function can be one or more of a leakage reduction with a delay overhead, a delay reduction with a leakage overhead, or a simultaneous leakage and delay reduction. All the cell-variants corresponding to a nominal cell possess the property of layout equivalence with respect to the nominal cell. The cell-variants can be broadly classified into three groups, corresponding to the objective functions: leakage reduction variants, delay reduction variants, and dominant variants, respectively. A leakage-reduction variant cell has reduced leakage power consumption, as compared to the corresponding nominal cell. Similarly, a delay-reduction variant cell is superior to the corresponding nominal cell in terms of performance. A dominant variant cell is superior to the corresponding nominal cell with respect to both leakage reduction and performance.

A leakage-reduction variant is generated by determining a positive bias solution, based on an allowable delay overhead. Typically, applying a positive bias solution to the transistor parameter of the transistor reduces its Ion value. Therefore, applying the positive bias solution to at least one transistor results in a delay overhead in the corresponding nominal cell. This delay overhead is calculated and a positive bias solution is chosen, which results in an allowable delay overhead. Similarly, the delay-reduction variant is generated by determining a negative bias solution, based on a leakage overhead.

An embodiment of the present invention classifies cell-variants into two types, based on the bias solution assignment. These two types are Cell Level Biased (CLB) variants and Transistor Level Biased (TLB) variants. For CLB variants, an equal bias solution is assigned to the transistor parameter of each transistor of a nominal cell. For TLB variants, the transistors of the nominal cell are not necessarily assigned equal bias solutions for their respective transistor parameter values.

An embodiment of the present invention further classifies CLB variants into four categories, based on the objective function. These categories are a maximum leakage-reduction variant (C_Pmax), a maximum delay-reduction variant (C_Nmax), a fractional maximum leakage-reduction variant (C_Pn), and a fractional maximum delay-reduction variant (C_Nn). In an embodiment of the present invention, the C_Pmax variant has the maximum leakage reduction of all variants corresponding to a particular cell. Similarly, the C_Nmax variant has the maximum delay reduction of all variants corresponding to a cell. C_Pmax variants are generated by increasing the magnitude of the transistor parameter of each transistor of the nominal cell to a maximum positive allowed value. A C_Pmax variant is used when there is a high positive timing slack on a path on which the nominal cell lies. C_Nmax variants are generated by decreasing the magnitude of the transistor parameter of all the transistors of the nominal cell to a minimum allowed negative value. A C_Nmax variant is used when a path on which the nominal cell lies has a high negative timing slack. For C_Pn variants, the transistor parameters of all the transistors of the nominal cell are biased to a fraction of the maximum positive value. A C_Pn variant is used when the nominal cell is on a path that has a medium positive timing slack. Similarly, C_Nn variants, the transistor parameters of all the transistors of the nominal cell are biased to a fraction of the maximum negative value. C_Nn variants are used when the nominal cell is on a path that has a medium negative timing slack.

As compared to the CLB variants, the TLB variants can use different bias solutions for the transistor parameters of the different transistors of the same nominal cell. In an embodiment of the present invention, the TLB variants can be further divided into seven categories, based on the objective function. These categories are a delay upper-bounded leakage reduction variant (A_P), a leakage-bounded delay reduction variant (A_N), a fall-delay affected leakage reduction variant (R_P), a rise-delay affected leakage reduction variant (F_P), a rise-delay reduction variant (R_N), a fall-delay reduction variant (F_N), and a dominant variant (D). The A_P variant, the R_P variant or the F_P variant corresponding to a particular nominal cell, has smaller leakage than the nominal cell. The A_N variant, the R_N variant or the F_N variant corresponding to a nominal cell has improved performance compared to the nominal cell. The A_P variant is used when the nominal cell lies on a path that has a medium positive timing slack. The A_N variant is used when the nominal cell lies on a path that has a medium negative timing slack. The R_P variant is used when the nominal cell lies on a path that has a high positive fall timing slack and a low positive rise timing slack. The F_P variant is used when the nominal cell lies on a path that has a high positive rise-timing slack and a low positive fall-timing slack. The R_N variant is used when the nominal cell lies on a path that has a high negative rise-timing slack and a low negative fall slack. The F_N variant is used when the nominal cell lies on a path that has a high negative fall-timing slack and a low negative rise-timing slack. The bias solution used for the D variant can be positive bias values as well as negative bias values. The cells replaced by the dominant variant have higher speed and smaller leakage than the unbiased nominal cell. In an embodiment of the invention, D variant cells are superior in leakage and delay to the corresponding nominal cells. In another embodiment of the invention, D variant cells are superior in leakage and equal in delay to the nominal cells. In yet another embodiment of the invention, D variant cells are superior in delay and equal in leakage to the nominal cells. The D variants are further explained in conjunction with FIG. 10. Further, the choice of the cell-variants is based on layout and design rule constraints as well as on technology constraints.

| Type of biasing of variants | Rise timing slack | Fall timing slack | Cell-variant used |
| --- | --- | --- | --- |
| Positive | High - Positive | High - Positive | C_Pmax |
| Positive | Medium - Positive | Medium - Positive | C_Pn, A_P |
| Positive | High - Positive | Low - Positive | F_P |
| Positive | Low - Positive | High - Positive | R_P |
| Negative | High - Negative | High - Negative | C_Nmax |
| Negative | Medium - Negative | Medium - Negative | C_Nn, A_N |
| Negative | High - Negative | Low - Negative | R_N |
| Negative | Low - Negative | High - Negative | F_N |

The usage of these different cell-variants in the design depends on the timing constraints placed on individual cell instances. In particular, it depends on setup or late mode-timing slack and hold or early mode-timing slack. The positively biased variants are used when there is enough positive setup-timing slack and small or negative hold-timing slack. The negatively biased variants are used when there is enough positive hold-timing slack or negative setup-timing slack.

FIG. 1 is a graph representing the ratio of leakage current and drive current (Ioff/Ion) of PMOS and NMOS transistors in a generic 90 nm (nanometer) process technology. FIG. 1 emphasizes the need for transistor-level biasing (TLB) in the present invention. FIG. 1 includes curve 102 and curve 104. Curve 102 represents the relationship between Ioff/Ion (Y-axis) and a transistor parameter (X-axis) of a NMOS transistor. The transistor parameter can be either a transistor gate-length (as shown in graph) or a threshold voltage (not shown in graph) or both. Curve 104 represents the relationship between Ioff/Ion (Y-axis) and a transistor parameter (X-axis) of a PMOS transistor. The transistor gate length is taken as the transistor parameter in FIG. 1. A plurality of integral values of the transistor gate length (nm) is marked on the X-axis of both the curves. In an embodiment of the present invention, such a set of integral values is known as a set of allowable biases. It will be apparent to one skilled in the art that a similar curve can also be obtained when the transistor parameter is the threshold voltage. In other words, a curve illustrating the relationship between Ioff/Ion and the threshold voltage of PMOS and NMOS transistors can be obtained. It is clear from curves 102 and 104 that, for the particular technology under consideration, a PMOS transistor shows a larger Ioff spread for a given Ion spread than the NMOS transistor. From the curves 102 and 104, it is evident that changing a gate length of an NMOS and a PMOS transistor by the same amount results in a larger reduction in the Ioff/Ion value of the PMOS transistor than that of the NMOS transistor. In other words, biasing the PMOS transistor provides a larger leakage power reduction for a given delay overhead than biasing the NMOS transistor does. Assigning equal bias solutions to the NMOS and PMOS transistors results in suboptimal reduction of leakage power consumption. From the curves 102 and 104, it is also evident that the change in the value of Ioff/Ion decreases when larger bias solutions are applied. Based on this observation, the maximum bias solution to be applied to improve the Ioff/Ion is restricted to 10 percent of the transistor gate-length, in an embodiment of the present invention. Assignment of the bias solution to the transistor parameter is further constrained by the layout and design-rule constraints, the technology constraints and the timing slack characteristics of the nominal cell. Based on the above facts, the present invention implements the assignment of the bias solution at the transistor level within a nominal cell.

Figure 2:
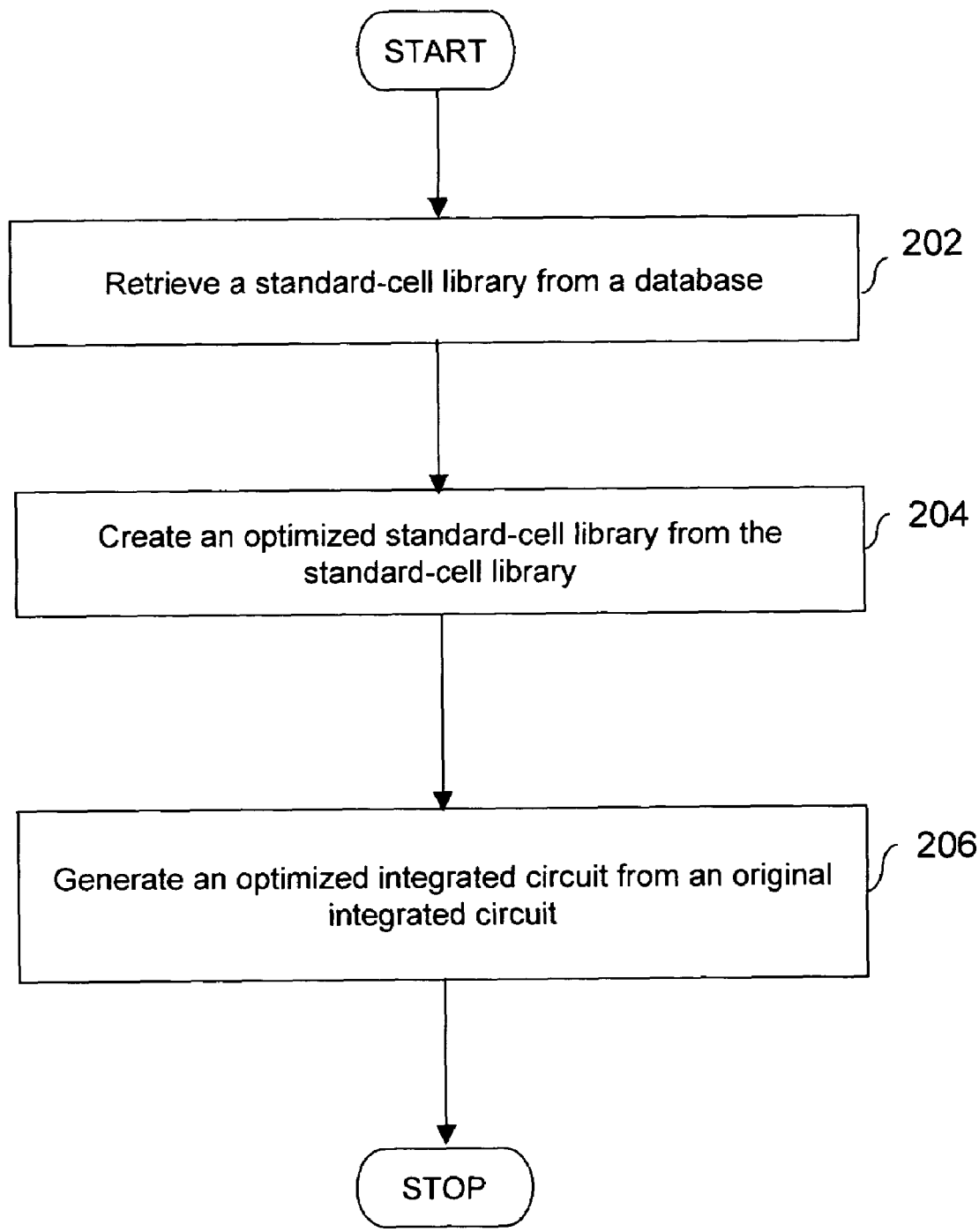
FIG. 2 is a flowchart of a method for integrated circuit optimization, in accordance with an embodiment of the present invention.

FIG. 2 is a flowchart of a method for integrated circuit (IC) optimization, in accordance with an embodiment of the present invention. Optimization of the IC involves reducing leakage power consumption by reducing the leakage current (Ioff) and improving the performance of the IC by increasing the driven current (Ion). At step 202, a standard-cell library is retrieved from a database, the standard-cell library includes a plurality of nominal cells, where each of the plurality of nominal cells includes a plurality of transistors. For example, the standard-cell library databases include Virtex-4™ from Xilinx, Hardcopy II™ from Altera, HSC180™ from Magna-Chip and CMOS065LP™ from STMicroelectronics. At step 204, an optimized standard-cell library is created from the standard-cell library. The optimized standard-cell library is created by modifying one or more of the nominal cells into variant cells. Creating the optimized standard-cell library is described further in conjunction with FIGS. 3 and 4. At step 206, an optimized IC is generated from an original IC. The original IC includes a plurality of nominal cells, and each of the nominal cells includes a plurality of transistors. Generating the optimized IC is described further in conjunction with FIG. 5.

Figure 3:
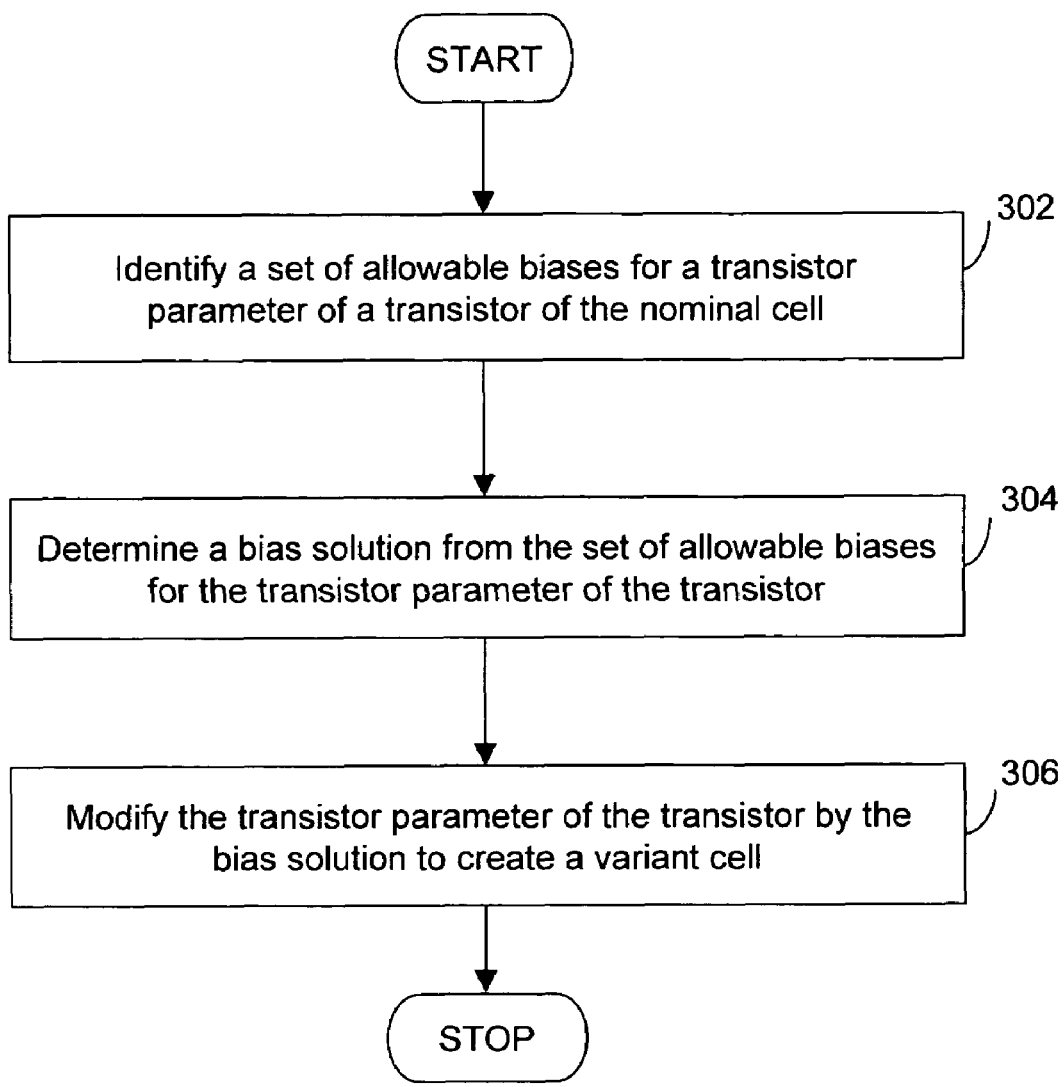
FIG. 3 is a flowchart of a method for creating an optimized standard-cell library from a standard-cell library, in accordance with an embodiment of the present invention.

FIG. 3 is a flowchart of a method for creating an optimized standard-cell library from a standard-cell library, in accordance with an embodiment of the present invention. At step 302, a set of allowable biases is identified, as described below, for a transistor parameter of a transistor of a nominal cell. The set of allowable biases is selected so as to avoid usage of large magnitudes of bias solutions, thereby reducing the impact of bias solutions on the process margin and yield. The set of allowable biases is chosen by taking standard-cell library size and design space into consideration. In an embodiment of the present invention, the set of allowable biases are restricted within the range of 10 percent deviation to the magnitude of a gate length of a transistor of the nominal cell (described in conjunction with FIG. 1). Again, the bias solutions for process-critical transistors are restricted to comparatively smaller magnitudes. The process-critical transistors, for example, may have narrow transistor gate-widths or may be placed closer to the nearest other layout geometries than the non-process critical transistors in the IC layout. The nearest other layout geometries can be other transistors or contacts.

Again, the identification of the set of allowable biases is based on one or more layout and design-rule constraints, as well as technology constraints. Once a transistor has been laid out in a layout design, increasing its gate length alters the spacing between the transistor and the nearest other layout geometries. Applying bias solutions to the transistor parameter can therefore potentially introduce layout and design-rule violations in a layout of the original IC. Among the design rules that can possibly be violated due to an increased transistor gate length are the polysilicon gate-to-polysilicon gate minimum-spacing rule and the polysilicon gate-to-active contact-spacing rule. The polysilicon gate-to-polysilicon gate minimum-spacing rule requires that a certain minimum distance be maintained between two adjacent polysilicon gates. For polysilicon gates that are laid out very close to each other, increasing the gate length can potentially violate the minimum spacing rule. The polysilicon gate-to-active contact-spacing rule requires that a certain minimum distance between a polysilicon gate and a contact made from the Metal 1 layer to the drain or source active regions be maintained. For a narrow transistor drain or transistor source regions, the contacts could potentially be very close to the transistor gate, and this constraint could be violated while increasing the transistor gate-length. The layout and design rule constraints mentioned above must be taken into account while determining the set of allowable biases for modifying a particular transistor of the nominal cell. At step 304, a bias solution is determined from the set of allowable biases for the transistor parameter of the transistor of the nominal cell. Determining the bias solution is further explained in conjunction with FIG. 4. At step 306, the transistor parameter of the transistor of the nominal cell is modified by the bias solution to create a variant cell.

Figure 4:
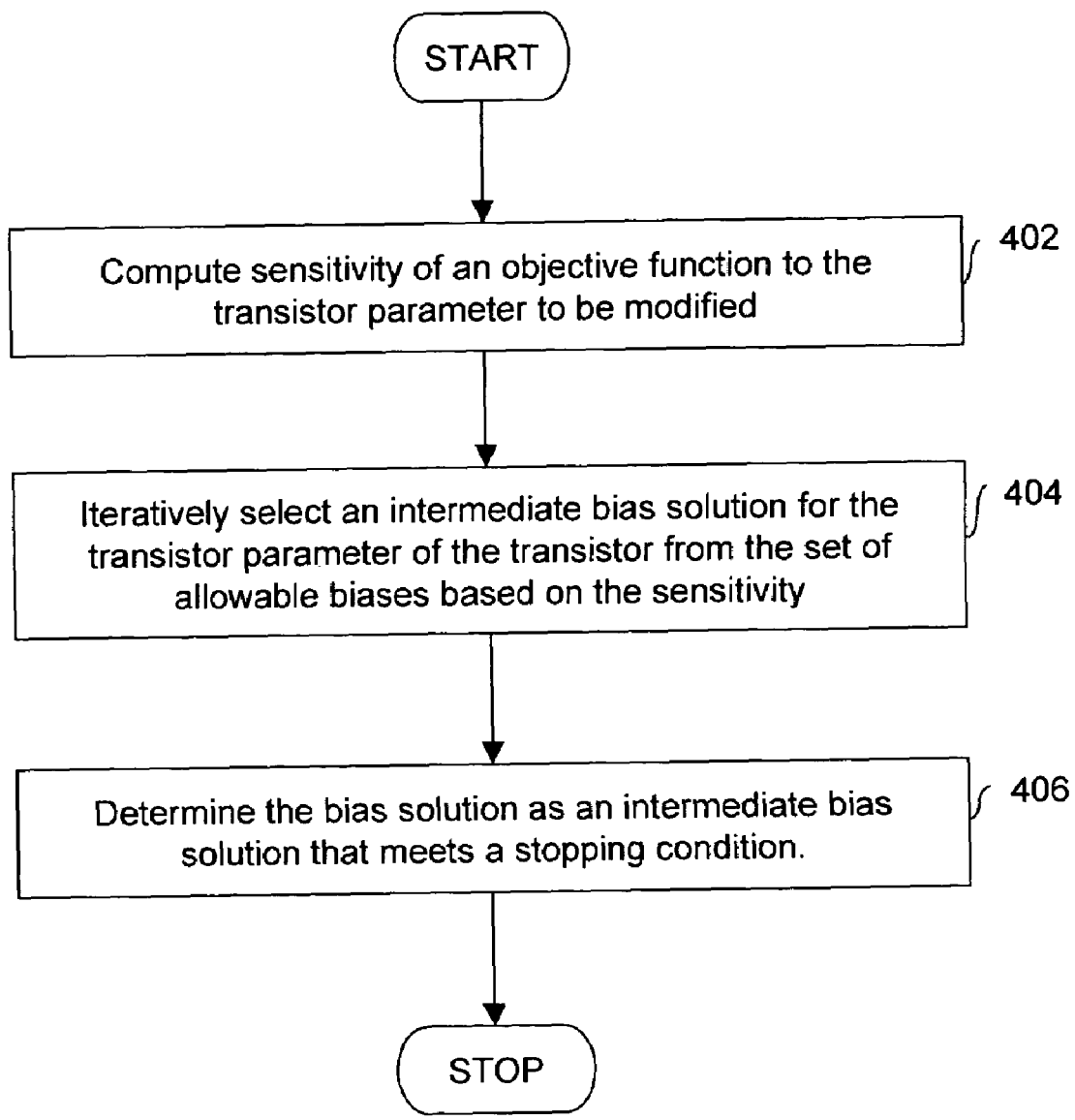
FIG. 4 is a flowchart of a method for determining a bias solution and creating an optimized standard-cell library from a standard-cell library, in accordance with an embodiment of the present invention.

FIG. 4 is a flowchart of a method for determining a bias solution and creating an optimized standard-cell library from a standard-cell library, in accordance with an embodiment of the present invention. In an embodiment of the present invention, the determination of the bias solution is guided by a figure of merit of an objective function such as a leakage reduction with a delay overhead, a delay reduction with a leakage overhead, or a simultaneous leakage and delay reduction to the transistor parameter. The objective function is considered, based on criteria including leakage reduction and delay reduction. At step 402, the sensitivity of an objective function to the transistor parameter is computed, as described below. The sensitivity of the objective function is the figure of merit for assigning a larger bias solution to the transistor parameter of the transistor. In an embodiment of the present invention, when the sensitivity of the objective function to the transistor parameter is larger, the transistor parameter should be assigned a larger bias solution. In an embodiment of the invention, the sensitivity represents the information about the leakage reduction obtained for a fixed delay overhead. Computation of the sensitivity depends on the cell-variants to be used. CLB cell-variants do not require the sensitivity to be computed, since the same bias solution is assigned to the transistor parameters of the all transistors of a nominal cell. For those cell-variants that seek to achieve a leakage reduction with an increase in average delay (A_P), as well as those cell-variants for which delay reduction is desired with leakage overhead (A_N), the following equation (Equation (1)) is used to compute the sensitivity S of a transistor:

$$S = (\Delta \text{Leak})/(\Delta \text{Del}) \quad (1)$$

where $\Delta$Leak represents the percentage change in the leakage of the nominal cell, when the transistor parameter is modified and $\Delta$Del represents the percentage change in the delay of the nominal cell, when the transistor parameter is modified. $\Delta$Del is computed as the average change in the delay of all input transitions of the nominal cell, also known as the average delay overhead of the nominal cell.

For cell-variants such as R_P, F_P, R_N or F_N, where only the delay of the rise (or fall) transition is impacted while the delay of the other transition is not affected, an embodiment of the present invention uses a slight modification of Equation (1). For example, Equation (2) is provided for the R_P variant. It is desirable for transistors that affect the output rise transition have a significantly lower sensitivity than other transistors. Given this consideration, the denominator of Equation (1) can be altered to yield a new sensitivity equation (2).

$$S_{rise} = (\Delta \text{Leak})/(\Delta \text{Del}_{rise} + k) \quad (2)$$

Here $\Delta \text{Del}_{rise}$ is the average delay overhead for all rise transitions of the nominal cell. The transistors that significantly affect the rise transition are assigned near-zero sensitivity by setting the value of constant k in Equation (2). The transistors that significantly affect the rise transition appear in either a charging or a discharging path during the input rise transition. Some other transistors also affect the rise transition by appearing as a load in the charging or discharging path. In an embodiment of the present invention, the sensitivity of these transistors is much higher than the sensitivity of transistors that are in the charging or discharging path, but lower than the sensitivity of transistors that do not affect the rise transition at all. The effect of Equation (2) is that (i) transistors that significantly affect the rise transitions are not biased, (ii) transistors that do not affect the rise transition are biased by a bias solution that is as high as possible, and (iii) the remaining transistors have intermediate values of the bias solution.

A third exemplary class of sensitivity computation methods is used for the generation of dominant variants. For dominant variants, it is desirable to create a variant-cell that can replace the nominal cell in the standard-cell library. The variant-cell should be superior to the nominal cell in the leakage and timing of every path. In an embodiment of the present invention, this motivates the following definition (Equation (3)) for the sensitivity of the dominant variants, where the denominator is no longer the average delay overhead but rather the maximum delay overhead ($\Delta \text{Del}_{max}$) across the entire set of timing paths:

$$S = \Delta \text{Leak}/(\Delta \text{Del}_{max}) \quad (3)$$

Figure 5:
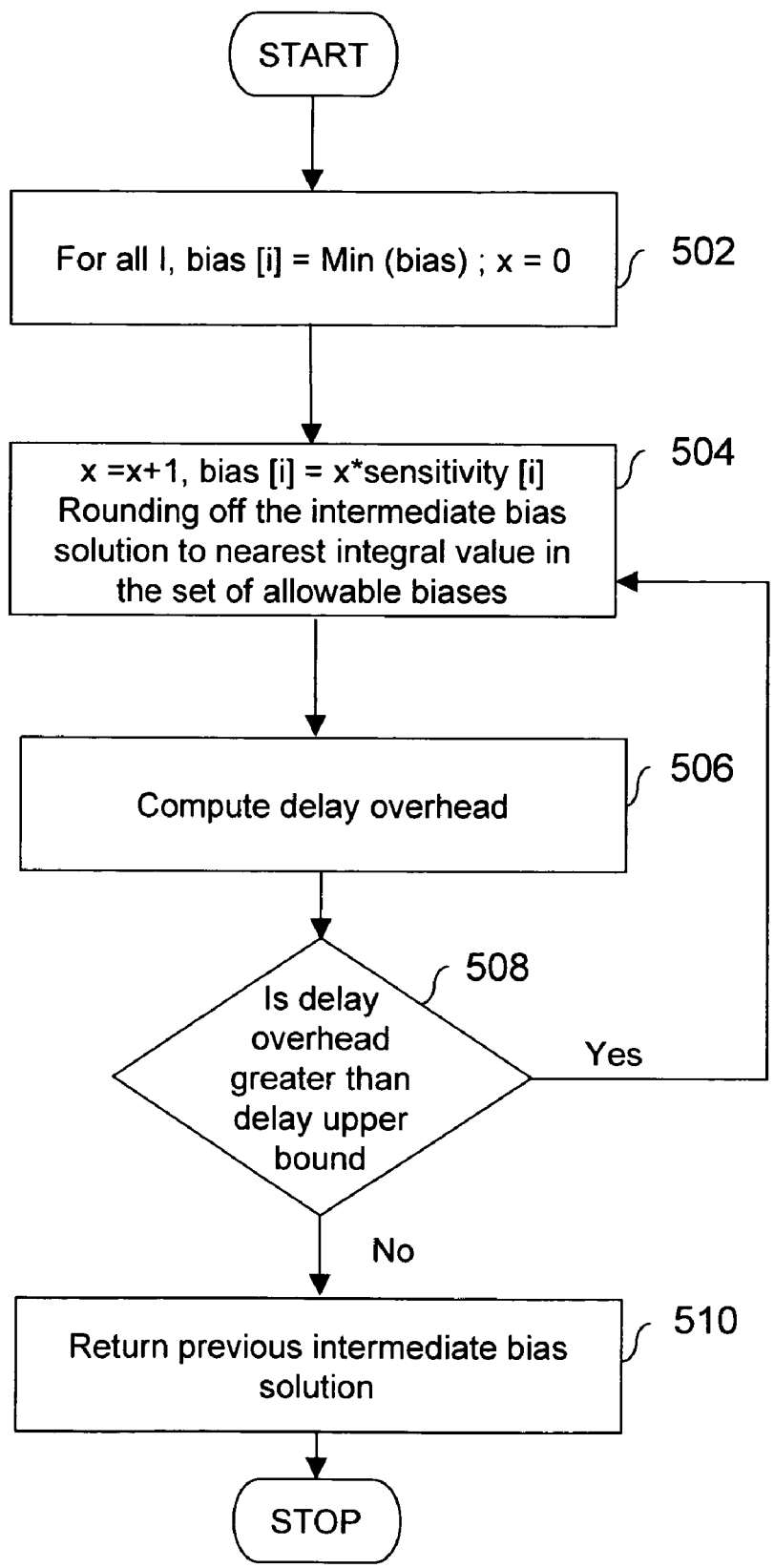
FIG. 5 is a flowchart representing a biasing algorithm, in accordance with an embodiment of the present invention

It is noteworthy that the sensitivity equations are unaltered even for negatively biased variants such as A_N, R_N and F_N. For negatively biased variants, it is advantageous to decrease the bias (make the bias more negative) for those transistors that provide larger delay savings for a given leakage overhead. Transistors that provide larger delay savings for a given leakage overhead have the least sensitivity. In the description of FIG. 5, an exemplary iterative heuristic for bias assignment is described, for which the heuristic starting point is the minimum (most negative) bias.

At step 404, an intermediate bias solution for the transistor parameter of the transistor is selected from the set of allowable biases, based on a biasing algorithm as described below. The computation of the intermediate bias solution is an iterative process in the biasing algorithm. At step 406, a bias solution is determined, based on a stopping condition as is also described below. One intermediate bias solution, based on the stopping condition, is treated as the bias solution for a transistor parameter of a transistor of a nominal cell. This is further explained in conjunction with FIG. 5.

FIG. 5 is a flowchart representing a biasing algorithm, in accordance with an embodiment of the present invention. FIG. 5 explains the biasing algorithm for determining the bias solution for the A_P variant. At step 502, all the transistors of a nominal cell are biased to a minimum bias. In one embodiment of the present invention, the minimum bias for the A_P variant is the zero bias. At step 502, an index (x) is set to zero. At step 504, x is incremented by one and a bias for a transistor is calculated by multiplying the sensitivity of the transistor and the incremented index. The calculated bias can have a magnitude that is not an allowed bias. In one embodiment of the present invention, the calculated bias can be rounded off or truncated to a nearest allowable bias. This nearest allowed bias is known as an intermediate bias solution. At step 506, a delay overhead is computed for the nominal cell, biased by the intermediate bias solution. In one embodiment of the present invention, the delay overhead represents the percentage increase in the value of the delay, as compared to the nominal cell. The change in the value of the delay is measured across the modified cell with respect to the nominal cell. The modified cell is the nominal cell that is biased by the intermediate bias solution. At step 508, the delay overhead is compared to a delay upper bound to check for a stopping condition. When the delay overhead is less than the delay upper bound, the step 502 is performed again for all the transistors of the nominal cell. Steps 502 to 508 are repeated for a transistor of the nominal cell until the value of the delay overhead does not exceed the delay upper bound. At step 510, when the delay overhead exceeds the delay upper bound for the transistor, a previous intermediate solution is returned as the bias solution for the transistor. This is the stopping condition for the biasing algorithm for the transistor. The previous intermediate solution is the last intermediate bias solution for which the delay overhead does not exceed the delay upper bound. The algorithm given above is used to determine the bias solutions for all the transistors of the nominal cell.

For A_N variants, the iterative biasing algorithm explained above is used with slight modifications. For the A_N variant, all the transistors of a nominal cell are set to a minimum bias before applying Equation (1). In an embodiment of the present invention, the minimum bias is taken as the maximum negative bias among the set of allowable biases for all the transistors of the nominal cell. Further, the index is increased towards the positive biases from the maximum negative biases. In an embodiment of the present invention, the stopping condition for the biasing algorithm arrives when the leakage is reduced for a specified delay improvement for a maximum value of x.

For the generation of the R_P variants, it is desired to achieve maximum possible leakage reduction without impacting the rise transitions. Hence, it is logical to take the minimum bias of the biasing algorithm as a zero bias and step up the index x. The exit condition in this case is when all the transistors with a high-sensitivity have reached a maximum bias. The maximum bias is returned as the bias solution for the R_P variant. It will be apparent to a person skilled in the art that determining the bias solution for the fall-limited (F_P) variants is analogous and can be easily inferred from the preceding description.

For the generation of cell-variants where rise transitions are made faster, as in the R_N variant, the minimum bias of the biasing algorithm is chosen to have the maximum negative value. The stopping condition of the biasing algorithm is different in this case. The stopping condition holds when the negative bias has been removed from all the transistors that do not affect rise transitions, and only those transistors that affect rise transitions have a negative bias. This intermediate bias solution is then returned as the bias solution. The generation of fall-enhancing (F_N) variants is analogous to the generation of rise-enhancing R_N variants. A person skilled in the art can obtain a similar biasing algorithm for the F_N variants.

For the generation of a D variant, the minimum bias for the biasing algorithm is chosen to be the maximum negative value within the set of allowable biases. The index of biases is incremented in proportion to the sensitivity of the objective function. The first intermediate bias solution is identified, at which the modified cell has less leakage value and less delay than the nominal cell. This is the stopping condition for the biasing algorithm for the D variant. This first intermediate bias solution is returned as the bias solution.

Figure 6:
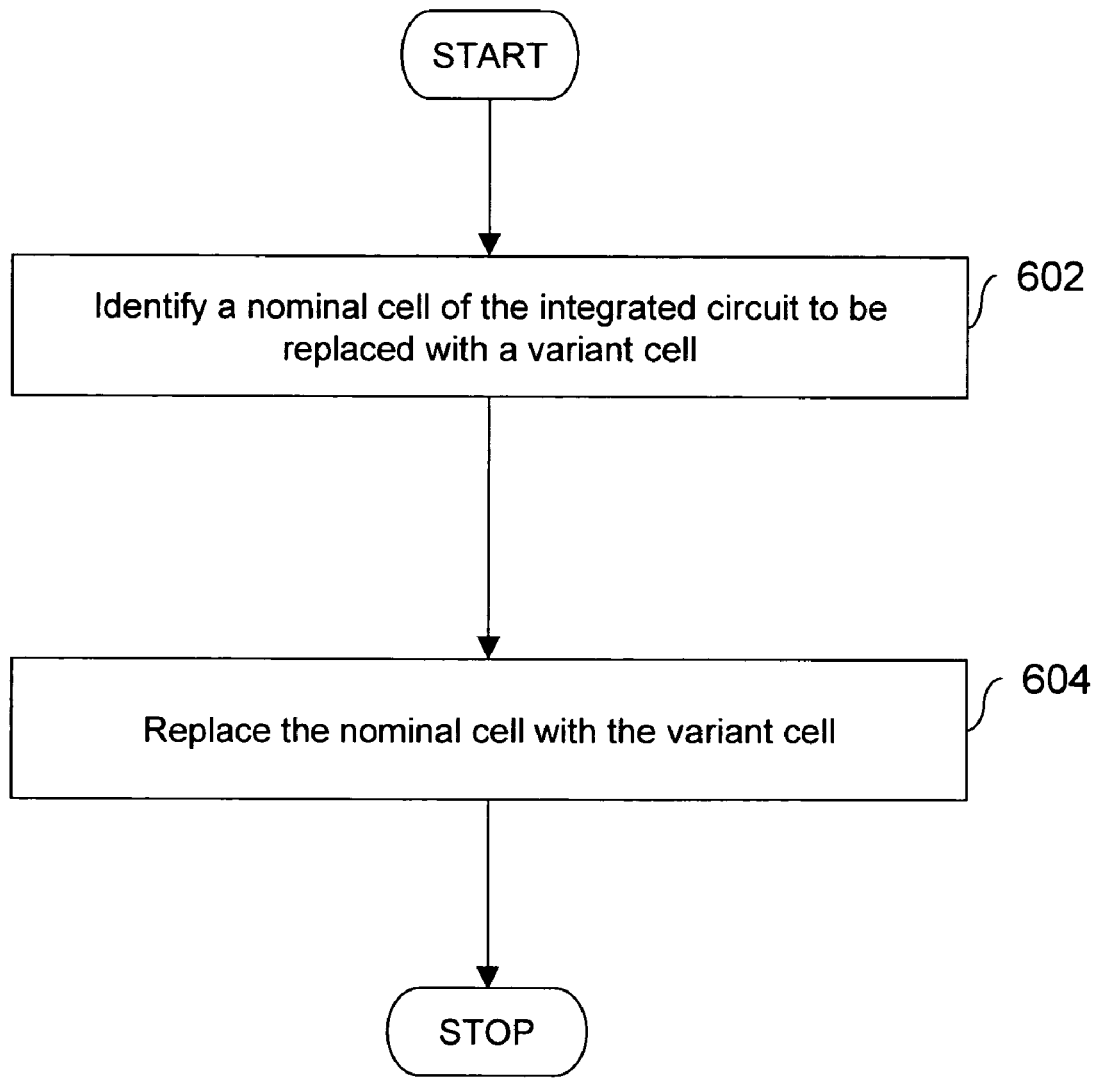
FIG. 6 is a flowchart of a method for generating an optimized integrated circuit from an original integrated circuit, in accordance with an embodiment of the present invention.

FIG. 6 is a flowchart of a method for generating an optimized IC from an original IC, in accordance with an embodiment of the present invention. At step 602, a nominal cell of the IC is identified base on the one or more objectives and constraints that needs to be replaced with certain cell-variants to create a variant cell. The one or more objectives include reducing leakage power consumption, performance improvement, leakage variability reduction, and performance variability reduction. The constraints include leakage power, dynamic power, capacitance, performance, leakage variability, performance variability, process margin, and yield. In an embodiment, a nominal cell is identified to be replaced by a variant cell when the variant cell has a smaller yield and process margin degradation than the corresponding nominal cell. Yield represents the proportion of the ICs in a lot, which perform satisfactorily. In an embodiment of the present invention, the yield-aware variant cell uses a yield-aware bias solution for at least one transistor of the nominal cell. At step 604, the nominal cell is replaced with the variant cell. Similarly, each nominal cell of the plurality of nominal cells, which are to be replaced by a variant cell, is identified and the optimized IC is generated.

The method given above for creating an optimized standard-cell library and generating an optimized IC can be embodied in an EDA tool, either jointly or separately. The optimized IC generated by the EDA tool has improved leakage power consumption and performance and parametric yield.

Figure 7:
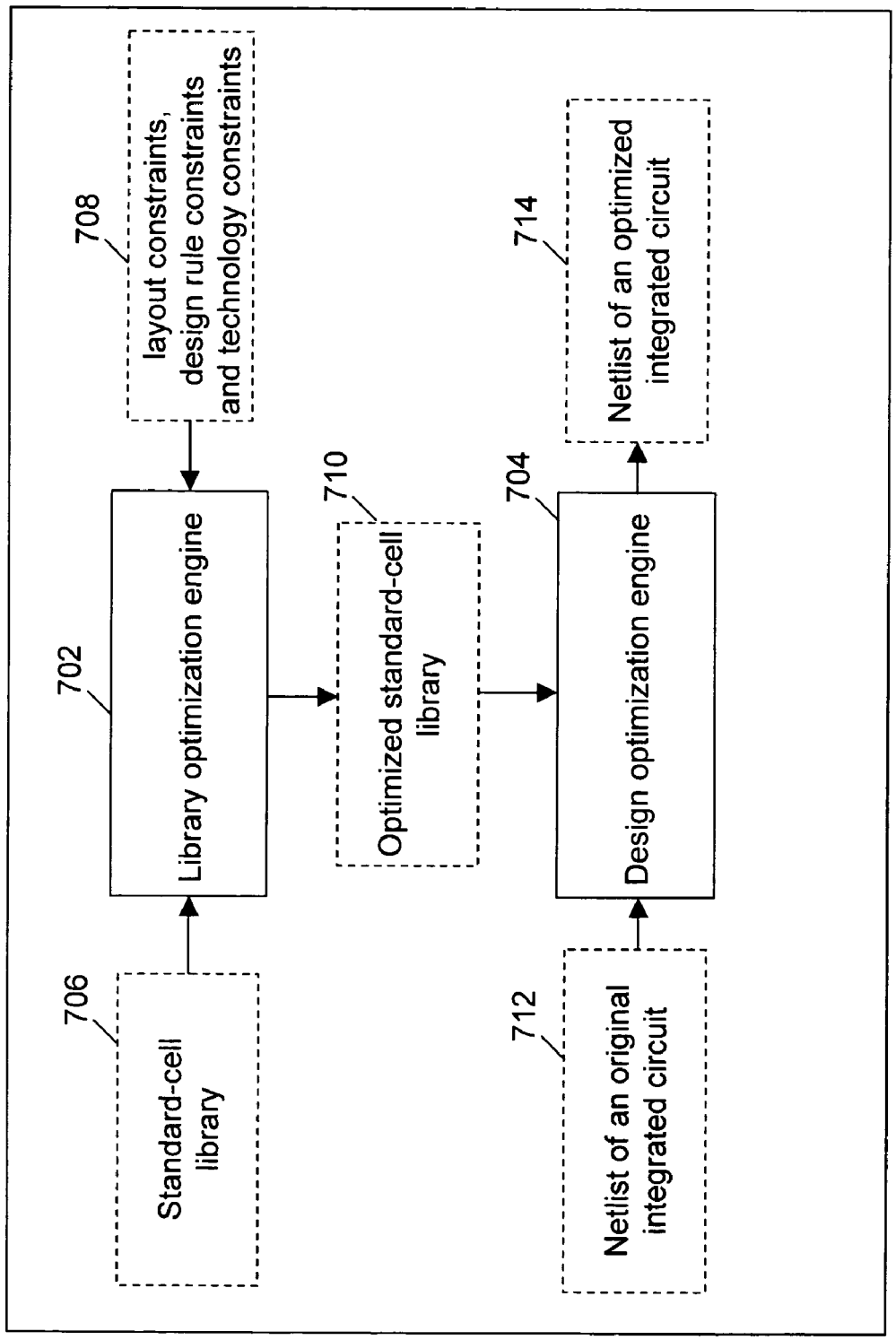
FIG. 7 is a block diagram of a system for integrated circuit optimization, in accordance with an embodiment of the present invention.

FIG. 7 is a block diagram of a system for IC optimization, in accordance with an embodiment of the present invention. FIG. 7 includes a library optimization engine 702, a design optimization engine 704, a standard-cell library 706, layout constraints, design rule constraints and technology constraints 708, an optimized standard-cell library 710, a netlist of an original IC 712, and a netlist of an optimized IC 714. Library optimization engine 702 creates optimized standard-cell library 710 from standard-cell library 706. The boxes in dashes represent either inputs or outputs in the system of FIG. 7. Library optimization engine 702 takes as input standard-cell library 706 and the layout constraints, design rule constraints and technology constraints 708. Library optimization engine 702 provides as output the optimized standard-cell library 710. This has been previously explained in conjunction with FIGS. 3 and 4. Design optimization engine 704 takes a netlist of an original IC 712 and the optimized standard-cell library 710 as input, and generates an output in the form of the netlist of an optimized IC 714. It will be apparent to a person skilled in the art that the design optimization engine 704 can also accept other forms of input such as the HDL code or a schematic of the circuits of the original IC. Design optimization engine 704 uses standard-cell library 710 for synthesis and optimization of the netlist of an original IC 712.

Figure 8:
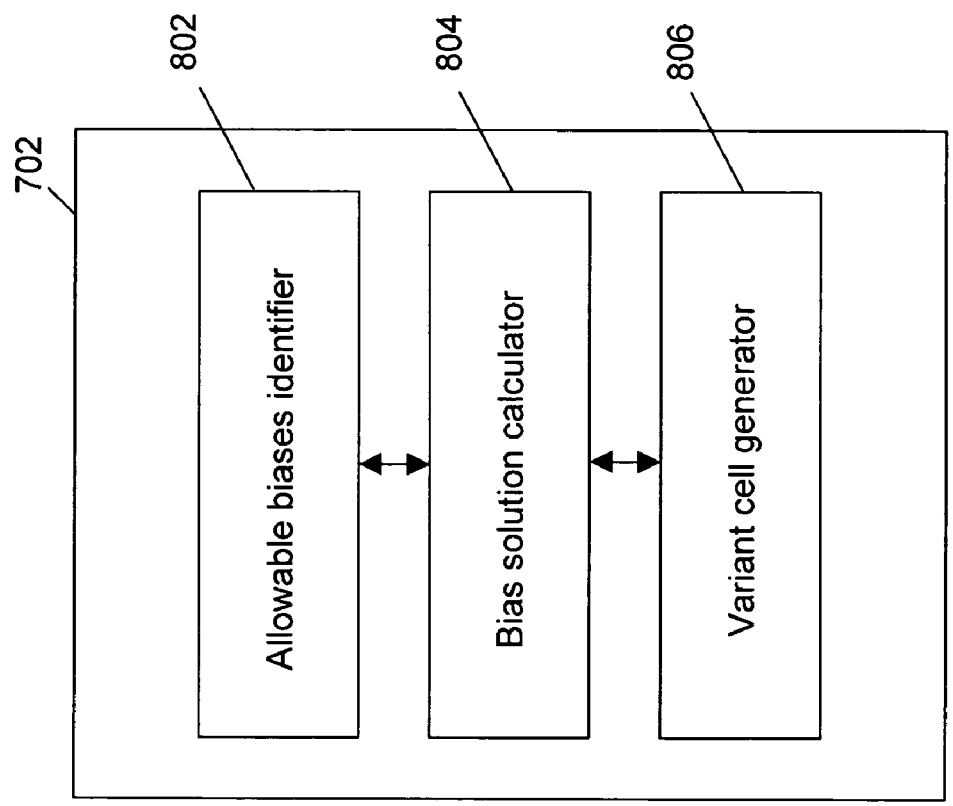
FIG. 8 is a block diagram of a library optimization engine, in accordance with an embodiment of the present invention.

FIG. 8 is a block diagram of the library optimization engine 702, in accordance with an embodiment of the present invention. The library optimization engine 702 includes an allowable biases identifier 802, a bias solution calculator 804, and a variant cell generator 806. Allowable bias identifier 802 identifies a set of allowable biases for a transistor of a nominal cell. In one embodiment of the present invention, the set of allowable biases are chosen to avoid the use of a large magnitude of bias values, to reduce the impact on process margin and yield. Bias solution calculator 804 calculates a bias solution to be assigned to the transistor parameter of the transistor of the nominal cell. This is explained further in conjunction with FIG. 9. Variant cell generator 806 modifies the transistor parameter of the transistor to create a variant cell. The optimized standard-cell library can include both the variant-cells and the nominal cells.

Figure 9:
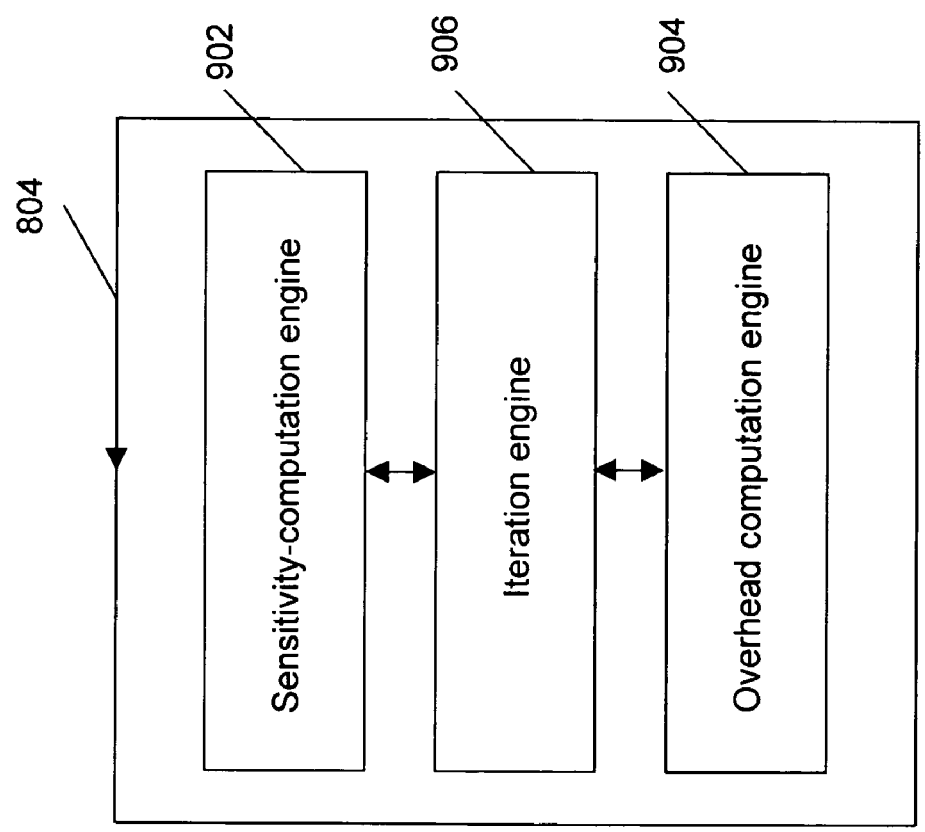
FIG. 9 is a block diagram of a bias solution calculator, in accordance with an embodiment of the present invention.

FIG. 9 is a block diagram of bias solution calculator 804, in accordance with an embodiment of the present invention. Bias solution calculator 804 includes a sensitivity-computation engine 902, an iteration engine 904, and an overhead-computation engine 906. Sensitivity-computation engine 902 computes the sensitivity of an objective function with respect to a transistor parameter to be modified. Again, the sensitivity of the objective function is the figure of merit for assigning a larger bias solution to the transistor parameter of a transistor. Computation of the sensitivity depends on the cell-variants to be used, as has been described previously in conjunction with FIG. 4. Iteration engine 904 iteratively selects a plurality of intermediate bias solutions from the set of allowable biases. Iteration engine 904 also determines an intermediate bias solution as the bias solution for the transistor parameter of the transistor, based on a stopping condition. The stopping condition depends on the cell-variants to be used. This is in accordance with the biasing algorithm explained in conjunction with FIG. 4. Overhead-computation engine 906 performs delay overhead computation and leakage overhead computation during the iterations of the biasing algorithm, based on the cell-variant to be used. The delay overhead is computed for a specific path of the nominal cell. The computation of the delay overhead is a function of the delay at a path of the nominal cell when a plurality of input vectors is applied to the nominal cell. In one embodiment of the present invention, the computation of delay overhead for the nominal cell is unconstrained. In another embodiment of the present invention, the delay overhead is taken as an average delay of all transistors in the nominal cell. In yet another embodiment of the present invention, the delay overhead is taken as a maximum delay of any transistor in the nominal cell. The leakage overhead is a function of leakage over a plurality of input states of the nominal cell. In one embodiment of the present invention, leakage is computed for all the input states of all the transistors of the nominal cell, and an average of the leakage is taken. In another embodiment of the present invention, the computation of the leakage overhead is unconstrained. Since delay overhead and leakage overhead is computed multiple times during the biasing algorithm procedure, they must be efficiently implementable and have a reasonable computation time.

Figure 10:
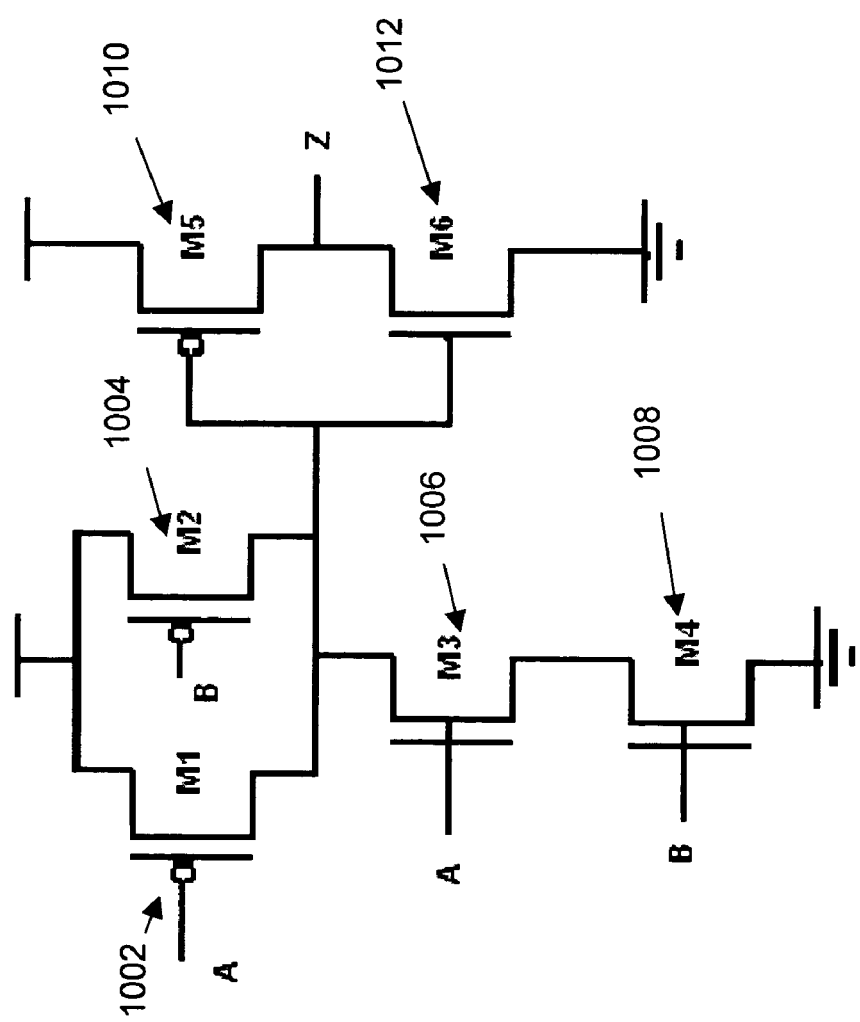
FIG. 10 is an exemplary circuit diagram of an AND gate.

FIG. 10 is an exemplary circuit diagram of an AND gate. FIG. 10 includes a PMOS transistor 1002, a PMOS transistor 1004, an NMOS transistor 1006, an NMOS transistor 1008, a PMOS transistor 1010, and an NMOS transistor 1012. The circuit of the AND gate is used to illustrate the delay and leakage computation procedure in the present invention. The computation of delay overhead in the circuit diagram of the AND gate of FIG. 10 is for illustrative purposes only, and it should be understood that it is not limiting in any way. In an exemplary embodiment of the present invention, the delay overhead is computed by an RC delay model such as those known in the art. The RC delay model computes the delay for every input state. A set of channel-connected transistors, referred to as a stage, forms the basic unit of analysis. Delay can be modeled by identifying a dominant leakage and the delay contributing transistors for each input state. For the input state '11' (A='1' and B='1') transistors 1006, 1008 and 1010 are in the conducting state. These transistors are in the charging/discharging path for the '11' input state and are treated as delay dominant transistors for the '11' input state. Transistors 1002, 1004 and 1012, which are turned OFF and not stacked on applying the input '11', are treated as leakage dominant transistors. Stacked refers to the transistors which are serially connected to the other OFF state transistors. Transistors that are neither in the charging path and the discharging path nor the OFF state, without being stacked, are treated as neither delay nor leakage dominant transistors. Subsequent to the identification of leakage dominant and delay dominant transistors, each stage is reduced to an RC pair by performing series-parallel reduction on the delay dominant transistors. The gate and junction capacitances of transistors are considered. For example, for transitions leading to input-state '11', the delay is expressed as in the following equation:

$$D = (R3+R4)(C5+C6+CJ1) + R5*(CL+CJ2) \qquad (4)$$

where $R_i$ is the resistance of $i^{th}$ transistor (Mi in FIG. 10); $C_i$ is the capacitance of $i^{th}$ transistor (Mi in FIG. 10); and $CJ_j$ is the junction capacitance of a stage j.

The resistance of each transistor is a function of its transistor gate-width, transistor gate-length and threshold voltage. Similar to resistance values, the capacitance of each transistor is a function of its transistor gate-width and transistor gate-length as well as its threshold voltage. Overhead-computation engine 906 obtains these values from a look-up table. The look-up table includes the values of resistances corresponding to the different transistor gate-widths and transistor gate-lengths. These values can be generated by (Simulation Program with Integrated Circuit Emphasis) SPICE simulation-based pre-characterization.

In an exemplary embodiment of the present invention, estimating the leakage overhead includes determining the leakage dominant transistors. For example, for the input state '11' in the exemplary AND gate in FIG. 10, transistors 1002, 1004, and 1012 are the leakage-dominant transistors. The total AND gate leakage corresponding to a state is the sum of the leakage currents of the dominant transistors. The leakage-currents are obtained from a look-up table generated by a SPICE simulation-based pre-characterization. In another embodiment of the present invention, the delay and leakage-overhead computation can be carried out by circuit simulation. The leakage and delay overhead can be computed, based on the simulation of the original IC. This is the most accurate approach to compute the delay and leakage values, but this method tends to take a high runtime for complex integrated circuits.

Figure 11:
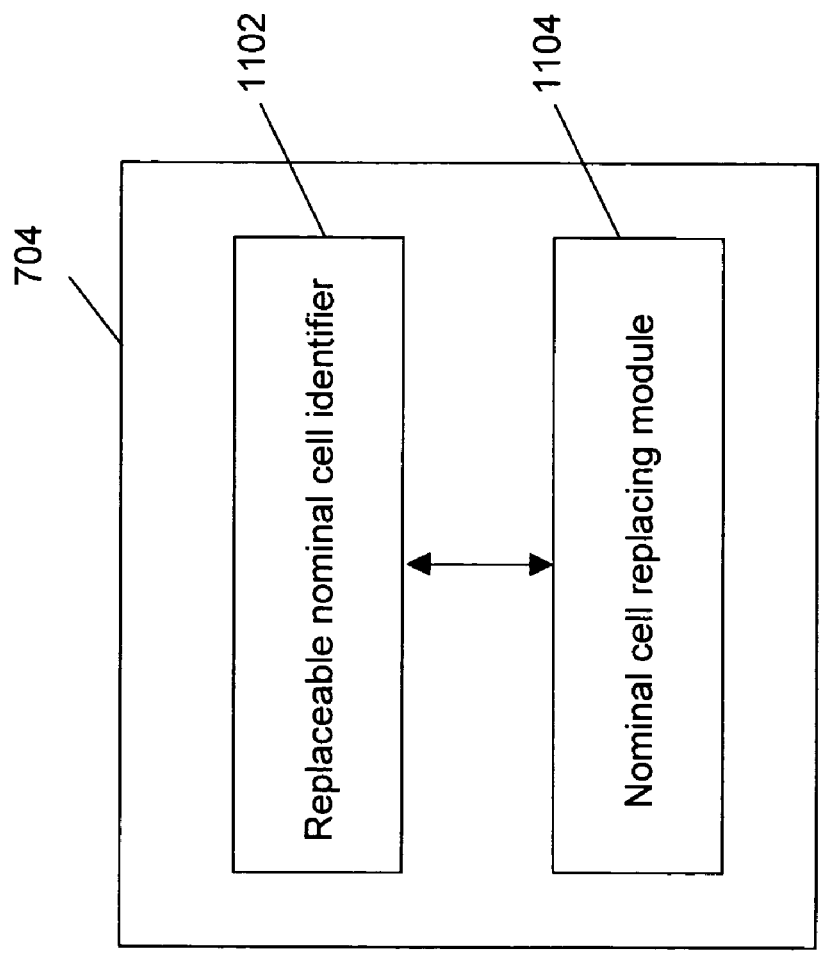
FIG. 11 is a block diagram of a design optimization engine, in accordance with an embodiment of the present invention.

FIG. 11 is a block diagram of a design optimization engine 704, in accordance with an embodiment of the present invention. The design optimization engine 704 includes a replaceable nominal cell identifier 1102 and a nominal cell replacing module 1104. Replaceable nominal cell identifier 1102 identifies the nominal cells of the original IC, which are to be replaced by the variant cells. Identifying the nominal cells is based on the one or more objectives and constraints. The one or more objectives include reducing leakage power consumption, improving performance, and reducing the leakage variability as well as the performance variability of the IC. Similarly, the constraints are leakage power, dynamic power, capacitance, performance, leakage variability, performance variability, process margin and yield. Nominal cell replacing module 1104 replaces the identified nominal cells by their corresponding variant cells, and thereby generates the optimized IC.

Various embodiments of the present invention offer the following advantages: an optimized standard-cell library is created, based on the cell-variants. The optimized standard-cell library has a plurality of variant cells, which have a changed transistor parameter, as compared to the corresponding nominal cells. The optimized IC generated by using the optimized standard-cell library has reduced leakage power consumption, increased performance and improved parametric yield. Due to the efficient and low runtime computation of the leakage and delay overhead, the biasing algorithm is effective in generating the plurality of variant cells.

The system for designing an IC, as described in the present invention, or any of its components, may be embodied in the form of a computer system. Typical examples of a computer system include a general-purpose computer, a programmed microprocessor, a micro-controller, a peripheral integrated circuit element, and other transistors or arrangements of transistors that are capable of implementing the steps that constitute the method of the present invention.

The computer system comprises a computer, an input unit, a display unit, and the Internet. The computer comprises a microprocessor, which is connected to a communication bus. The computer also includes a memory, which may include Random Access Memory (RAM) and Read Only Memory (ROM). The computer system further comprises a storage transistor, which can be a hard disk drive or a removable storage drive such as a floppy disk drive, optical disk drive, and so forth. The storage transistor can also be other similar means of loading computer programs or other instructions into the computer system.

The computer system executes a set of instructions that are stored in one or more storage elements, in order to process input data. The storage elements may also hold data or other information, as desired. The storage elements may be in the form of an information source or a physical memory element present in the processing machine. Exemplary storage elements include a hard disk, a DRAM, an SRAM and an EPROM. The storage element may also be external to the computer system, and connected to or inserted into the computer, for downloading at or prior to the time of use. Examples of such external computer program products are computer-readable storage mediums such as CD-ROMS, Flash chips, floppy disks, and so forth.

The set of instructions may include various commands that instruct the processing machine to perform specific tasks, such as the steps that constitute the method of the present invention. The set of instructions may be in the form of a software program. The software may be in various forms, such as system software or application software. Further, the software may be in the form of a collection of separate programs, a program module with a larger program, or a portion of a program module. The software may also include modular programming in the form of object-oriented programming. The software program containing the set of instructions may be embedded in a computer program product, for use with a computer. The computer program product comprising a computer-usable medium may have a computer-readable program code embodied therein. Processing of input data by the processing machine may be in response to user commands, to results of previous processing, or to a request made by another processing machine.

While the foregoing is directed at embodiments of the present invention, other and further embodiments of the invention may be devised, without departing from the basic scope thereof, the scope thereof is determined by the claims that follow.

What is claimed is:

1. A method for integrated circuit optimization of an original integrated circuit using an optimized standard-cell library, the method comprising:
    retrieving a standard-cell library;
    creating an optimized standard-cell library from the standard-cell library, wherein the standard-cell library comprises a plurality of nominal cells, wherein each of the plurality of nominal cells comprises a plurality of nominal transistors, the plurality of nominal transistors forming the original integrated circuit;
    modifying the transistor parameter of the at least one transistor according to a bias solution, wherein a magnitude of the bias solution for a process-critical transistor is restricted;
    generating by a computer an optimized integrated circuit from the original integrated circuit using the optimized standard-cell library.

2. The method according to claim 1, wherein creating the optimized standard cell library from the standard-cell library, further comprises:
    identifying a set of allowable biases for a transistor parameter of at least one transistor of a nominal cell;
    determining the bias solution from the set of allowable biases for the transistor parameter of the at least one transistor of the nominal cell; and
    modifying the transistor parameter of the at least one transistor by the bias solution to generate a variant cell, wherein the variant cell and the nominal cell are a part of the optimized standard-cell library, wherein the variant cell includes at least one of a leakage reduction variant cell, a delay reduction variant cell and a dominant variant cell.

3. The method according to claim 2, wherein the transistor parameter includes at least one of a transistor gate-length and a threshold voltage.

4. The method of claim 2, wherein the bias solution is determined to be a yield-aware bias solution to reduce impact of the bias solution on process margin and yield.

5. The method according to claim 2, wherein the set of allowable biases is calculated based on one or more layout and design rule constraints and technology constraints.

6. The method according to claim 2, wherein modifying the transistor parameter of the at least one transistor of the nominal cell by a positive bias solution reduces leakage and increases delay of the nominal cell and wherein the step of modifying the transistor parameter of the nominal cell by a negative bias solution increases leakage and decreases delay of the nominal cell.

7. The method according to claim 2, wherein the leakage reduction variant is generated by determining a positive bias solution based on an allowable delay overhead compared to the nominal cell, wherein the allowable delay overhead is set from a computation of a delay overhead.

8. The method according to claim 2, wherein the delay reduction variant is generated by determining a negative bias solution based on an allowable leakage overhead with respect to the nominal cell, and the allowable leakage overhead is set from computing a leakage overhead.

9. The method according to claim 2, wherein a dominant variant is generated by applying a bias solution to the nominal cell, the bias solution consisting of both positive bias values and negative bias values.

10. The method according to claim 2, wherein determining the bias solution for a variant from the one or more variants, further comprises:
   computing a sensitivity of an objective function to the transistor parameter to be modified;
   iteratively selecting an intermediate bias solution for the transistor parameter from the set of allowable biases based on the sensitivity; and
   determining the bias solution as an intermediate bias solution that meets a stopping condition.

11. The method according to claim 10, wherein the objective function is based on one of a leakage reduction with a delay overhead, a delay reduction with a leakage overhead, or a simultaneous delay and leakage reduction of the nominal cell, caused by modifying the transistor parameter.

12. The method according to claim 1, wherein generating the optimized integrated circuit, further comprises:
   identifying at least one nominal cell of the original integrated circuit to be replaced with a variant cell generated by modifying the transistor parameter based on one or more objectives and constraints; and
   replacing the at least one nominal cell with the variant cell.

13. The method according to claim 12, wherein the one or more objectives includes reduction of leakage power consumption, performance improvement, leakage variability reduction, and performance variability reduction.

14. A system for integrated circuit optimization using an optimized standard-cell library, the system comprising:
   a library optimization engine for creating an optimized standard-cell library from a standard-cell library, wherein the standard-cell library comprises a plurality of nominal cells, wherein each of the plurality of nominal cells comprises a plurality of transistors;
   a variant cell generator for modifying the at least one transistor parameter by a bias solution, wherein a magnitude of the bias solution for a process-critical transistor is restricted; and
   a design optimization engine for generating an optimized integrated circuit from an original integrated circuit using the optimized standard-cell library, wherein the original integrated circuit comprises a plurality of nominal cells, wherein each of the plurality of nominal cells comprises a plurality of transistors.

15. The system of claim 14, wherein the library optimization engine comprises:
   an allowable biases identifier that identifies a set of allowable biases for at least one transistor parameter of at least one transistor of a nominal cell; and
   a bias solution calculator for calculating the bias solution from a set of allowable biases for the at least one transistor parameter.

16. The system according to claim 15, wherein modifying the transistor parameter of the at least one transistor of the nominal cell by a positive bias solution reduces leakage and increases delay of the nominal cell, and wherein modifying the transistor parameter of the nominal cell by a negative bias solution increases leakage and decreases delay of the nominal cell.

17. The system according to claim 15, wherein the leakage reduction variant is generated by determining a positive bias solution based on an allowable delay overhead compared to the nominal cell, wherein the allowable delay overhead is set from a computation of a delay overhead.

18. The system according to claim 15, wherein a delay reduction variant is generated by determining a negative bias based on an allowable leakage overhead with respect to the nominal cell, wherein the allowable leakage overhead is set from a computation of a leakage overhead.

19. The system according to claim 15, wherein the dominant variant is generated by applying a bias solution to the nominal cell, the bias solution consisting of both positive bias values and negative bias values.

20. The system according to claim 15, wherein the bias solution calculator comprises:
   a sensitivity-computation engine for computing sensitivity of an objective function with respect to a transistor parameter to be modified; and
   an iteration engine for iteratively selecting a plurality of intermediate bias solutions from a set of allowable biases and determining the bias solution as the intermediate bias solution that meets a stopping condition.

21. The system according to claim 15, wherein the bias solution calculator comprises:
   an overhead-computation engine for computing relative difference between delay of the nominal cell and delay of a modified cell, wherein the modified cell is a nominal cell modified by an intermediate bias solution.

22. The system according to claim 15, wherein the design optimization engine comprises:
   a replaceable nominal cell identifier for identifying at least one nominal cell of the integrated circuit to be replaced with a variant cell generated by the library optimization engine based on one or more objectives and constraints; and
   a nominal cell replacing module for replacing the at least one nominal cell with a variant cell created by the library optimization.

23. The system according to claim 15, wherein a variant cell is given preferential usage if it is a yield-aware variant cell, with the yield-aware variant cell having small yield and process margin degradation compared to the nominal cell.

24. The optimized standard-cell library of claim 14, wherein, for at least one nominal cell, different bias solutions are applied to different transistors.

25. The optimized standard-cell library of claim 14, wherein all variants corresponding to a nominal cell possess the property of layout-equivalence with respect to the nominal cell.

26. An integrated circuit generated using at least one of the variant cells of the optimized standard-cell library of claim 14, wherein the variant cell is not part of the standard-cell library.

27. A computer usable medium having stored therein an instruction set for a computer program, which when executed by a computer, causes the computer to implement an integrated circuit optimization of an original integrated circuit using an optimized standard-cell library, the instruction set comprising:
   program instructions for retrieving a standard-cell library;
   program instructions for creating an optimized standard-cell library from the standard-cell library, wherein the standard-cell library comprises a plurality of nominal cells, wherein each of the plurality of nominal cells comprises a plurality of nominal transistors, the plurality of nominal transistors forming the original integrated circuit, and a transistor parameter of at least one transistor is modified, wherein a magnitude of a bias solution for a process-critical transistor is restricted; and program instructions for generating an optimized integrated circuit from the original integrated circuit using the optimized standard-cell library.

28. The computer usable medium of claim 27, wherein the program instructions for creating an optimized standard-cell library from the standard-cell library, further comprising:

program instructions for identifying a set of allowable biases for a transistor parameter of at least one transistor of a nominal cell, wherein the transistor parameter is at least one of a transistor gate-length and a threshold voltage;

program instructions for determining the bias solution from the set of allowable biases for the transistor parameter of the at least one transistor of the nominal cell; and program instructions for modifying the transistor parameter of the at least one transistor by the bias solution to generate a variant cell, wherein the variant cell and the nominal cell are a part of the optimized standard-cell library, wherein the variant cell includes at least one of a leakage reduction variant cell, delay reduction variant cell and a dominant variant cell.

29. The computer usable medium of claim 28, wherein program instructions for determining a bias solution from a set of allowable biases, further comprising:

program instructions for computing sensitivity of an objective function to the transistor parameter to be modified, wherein the objective function is based on one of a leakage reduction with a delay overhead, a delay reduction with a leakage overhead, a simultaneous delay and leakage reduction of the nominal cell, caused by modifying the transistor parameter;

program instructions for iteratively selecting an intermediate bias solution for the transistor parameter from the set of allowable biases based on the sensitivity; and program instructions for determining the bias solution as an intermediate bias solution that meets a stopping condition.

30. The computer usable medium of claim 27, wherein program instructions for generating an optimized integrated circuit from the original integrated circuit, further comprising:

program instructions for identifying at least one nominal cell of the original integrated circuit to be replaced with the variant cell generated by modifying the transistor parameter based on one or more objectives and constraints; and program instructions for replacing the at least one nominal cell with the variant cell.

\* \* \* \* \*